United States Patent [19]
Lee

[11] Patent Number: 5,683,920
[45] Date of Patent: Nov. 4, 1997

[54] METHOD FOR FABRICATING SEMICONDUCTOR DEVICES

[75] Inventor: Kil Ho Lee, Kyoungki-do, Rep. of Korea

[73] Assignee: Hyundai Electronics Industries Co., Ltd., Kyoungki-do, Rep. of Korea

[21] Appl. No.: 768,940

[22] Filed: Dec. 18, 1996

[30] Foreign Application Priority Data

Dec. 29, 1995 [KR] Rep. of Korea ............... 95-66007

[51] Int. Cl.$^6$ ..................................... H01L 21/8238
[52] U.S. Cl. ........................... 437/34; 437/57; 437/162
[58] Field of Search ............................. 437/34, 56, 57, 437/58, 59, 41 RCM, 162, 913; 148/DIG. 123, DIG. 3

[56] References Cited

U.S. PATENT DOCUMENTS

| | | | |
|---|---|---|---|
| 4,786,611 | 11/1988 | Pfiester | 437/56 |
| 4,948,745 | 8/1990 | Pfiester et al. | 437/57 |
| 5,387,552 | 2/1995 | Iranmanesh | 437/34 |
| 5,399,506 | 3/1995 | Tsukamoto | 437/19 |
| 5,413,945 | 5/1995 | Chien et al. | 437/34 |
| 5,432,105 | 7/1995 | Chien | 437/162 |
| 5,464,789 | 11/1995 | Saito | 437/57 |
| 5,504,031 | 4/1996 | Hsu et al. | 437/162 |

*Primary Examiner*—Michael Trinh
*Attorney, Agent, or Firm*—Gary M. Nath; Nath & Associates

[57] ABSTRACT

A method for fabricating a semiconductor device which is capable of forming an ultra-shallow junction causing no defect in source/drain regions. The method includes the steps of providing a semiconductor substrate formed with n and p type wells and element-isolating films, forming gate oxide films on the n and p type wells, respectively, forming a polysilicon film over the entire exposed upper surface of the resulting structure, implanting first impurity ions having an n type conductivity in a portion of the polysilicon film disposed over the p type well, implanting first impurity ions having a p type conductivity in a portion of the polysilicon film disposed over the n type well, implanting second impurity ions having the p type conductivity in portions of the polysilicon film except for portions which will be used as gate electrodes, annealing the resulting structure in such a manner that the first impurity ions having the p type conductivity are diffused into the n type well, thereby forming p$^+$ source/drain, selectively removing the polysilicon film, thereby forming n and p type gate electrodes, and implanting second impurity ions having the n type conductivity in an exposed surface portion of the p type well, thereby forming n$^+$ source/drain.

20 Claims, 3 Drawing Sheets

METHOD FOR FABRICATING SEMICONDUCTOR DEVICES

BACKGROUND OF THE INVENTION

1. Field of the Invention

The present invention relates to a method for fabricating semiconductor devices, and more particularly to a method for fabricating a highly integrated semiconductor device having ultra-shallow junctions.

2. Description of the Prior Art

In the fabrication of semiconductor devices, an increase in integration degree inevitably results in the need to form surface channel type dual gate electrodes and a reduction in depth of source/drain junctions.

In this connection, an example of a conventional method for fabricating semiconductor devices will be described hereinafter in conjunction with FIG. 1.

FIG. 1 is a sectional view illustrating a semiconductor device fabricated in accordance with a conventional method.

In accordance with the method, a N-well 1, P-well 2 and element-isolating films 3 are formed on desired portions of a semiconductor substrate in order to form a P type MOSFET transistor and N type MOSFET transistor. Gate oxide films 4 are then formed on the N-well 1 and P-well 2, respectively. Thereafter, an undoped polysilicon layer is deposited over the gate oxide film 4. The polysilicon layer is then doped with $POCl_3$. Instead of such a polysilicon layer, a polysilicon layer, which is doped with an n type dopant in an in-situ manner, may be deposited over the gate oxide film 4. Gate electrodes 5 are formed on the gate oxide film 4 by patterning the polysilicon layer.

Subsequently, spacer oxide films 6 are formed on opposite side walls of each gate electrode 5.

Arsenic ions are then implanted in the exposed portion of the P-well 2 using the element-isolating film 3, gate electrodes 5 and spacer oxide films 6, thereby forming $n^+$ source/drain 7 in the P-well 2.

Thereafter, boron ions or boron fluoride ions are implanted in the exposed portion of the N-well 1, thereby forming $p^+$ source/drain 8 in the N-well 1.

However, the above-mentioned conventional method has various problems.

That is, the semiconductor device fabricated in accordance with the conventional method can not operate in a surface channel fashion because the gate electrode of the P type MOSFET transistor thereof is of an n type. As a result, there is difficulty in increasing the integration degree of the semiconductor device.

Furthermore, the conventional method inevitably involves a channeling phenomenon because an implantation of boron ions or boron fluoride ions is carried out to form a p type source/drain. Ion implantation defects may also occur. Such a channeling phenomenon and ion implantation defects result in a rapid diffusion of boron ions. As a result, it is very difficult to form a shallow junction.

The formation of such a shallow junction may be achieved by using an ion implanting device which carries out an ion implantation at very low energy. However, such an ion implanting device is not commercially available. For this reason, there is a limitation in forming a shallow junction.

Moreover, the silicon layer, in which dopant ions are implanted using the above-mentioned ion implanting device, may eventually have defects due to the ion implantation.

Consequently, the conventional method is improper for the fabrication of semiconductor devices exhibiting a superior electrical characteristic.

SUMMARY OF THE INVENTION

Therefore, an object of the invention is to solve the above-mentioned problems involved in the conventional method and to provide a method for fabricating a semiconductor device which is capable of forming an ultra-shallow junction causing no defect in source/drain regions.

Another object of the invention is to provide a method for fabricating a semiconductor device having an ultra-high integration degree.

In accordance with one aspect of the present invention, a method for fabricating a semiconductor device comprises the steps of: A method for fabricating a semiconductor device comprising the steps of: providing a semiconductor substrate formed with a first and second conductive type wells and element-isolating films; forming gate oxide films on the first and second conductive type wells, respectively; forming a polysilicon film over the entire exposed upper surface of the resulting structure obtained after the formation of the gate oxide films; implanting first impurity ions having an first type conductivity in a portion of the polysilicon film disposed over the second conductive type well; implanting first impurity ions having a second type conductivity in a portion of the polysilicon film disposed over the first conductive type well; implanting second impurity ions having the second type conductivity in portions of the polysilicon film except for portions which will be used as gate electrodes; annealing the resulting structure obtained after the implantation of the second impurity ions in such a manner that the first impurity ions having the second type conductivity are diffused into the first conductive type well, thereby forming a second conductive type source/drain; selectively removing the polysilicon film, thereby forming first and second conductive type gate electrodes; and implanting second impurity ions having the first type conductivity in an exposed surface portion of the second conductive type well, thereby forming a first conductive type source/drain.

In accordance with another aspect of the present invention, provides a method for fabricating a semiconductor device comprises the steps of: providing a semiconductor substrate formed with n and p type wells and element-isolating films; forming gate oxide films on the n and p type wells, respectively; forming a polysilicon film over the entire exposed upper surface of the resulting structure obtained after the formation of the gate oxide films; forming a first photoresist film pattern on a portion of the polysilicon film disposed over the n type well; implanting first impurity ions having an n type conductivity in a portion of the polysilicon film disposed over the p type well by use of the first photoresist film pattern as a mask; removing the first photoresist film pattern, and forming a second photoresist film pattern on the portion of the polysilicon film disposed over the p type well; implanting first impurity ions having a p type conductivity in the portion of the polysilicon film disposed over the n type well by use of the second photoresist film pattern as a mask; removing the second photoresist film pattern, and forming a third photoresist film pattern on the portions of the polysilicon film respectively disposed over the n and p type wells; implanting second impurity ions having the p type conductivity in the polysilicon film by use of the third photoresist film pattern as a mask; removing the third photoresist film pattern, and annealing the resulting structure, thereby forming $p^+$ source/ drain in the n type well; selectively removing the polysilicon film, thereby forming n and p type gate electrodes; forming a fourth photoresist film pattern on the exposed surface of the gate oxide film disposed over the n type well; and implanting second impurity ions having the n type conductivity in an exposed surface portion of the p type well, thereby forming n$^+$ source/drain.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
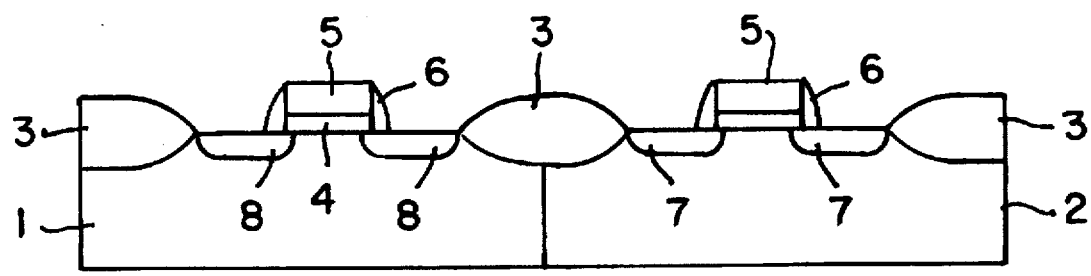
FIG. 1 is a sectional view illustrating a semiconductor device fabricated in accordance with a conventional method.
Figure 2:
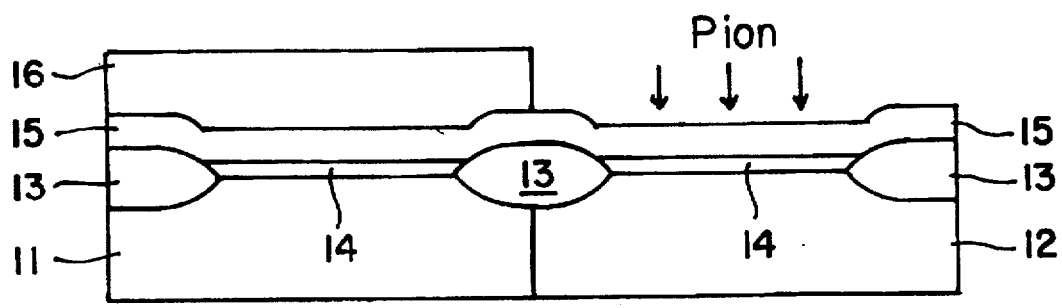
FIGS. 2 to 8 are sectional views respectively illustrating a method for fabricating a semiconductor device in accordance with the present invention.

FIGS. 2 to 8 illustrate sequential steps of a method for fabricating a semiconductor device in accordance with the present invention.

In accordance with the method of the present invention, N-well 11 and P-well 12 are formed in desired portions of a semiconductor substrate. Element-isolating films 13 are then formed on the silicon substrate in order to isolate element regions one from another. Thus, an N type MOSFET transistor and P type MOSFET transistor are obtained.

Thereafter, a gate oxide film 14 is formed over the entire exposed upper surface of the resulting structure. The gate oxide film 14 has a thickness of 30 to 60 Å.

A polysilicon film 15 is then deposited to a thickness of 1,500 to 2,500 Å in accordance with a low pressure chemical vapor deposition method. Instead of the polysilicon film 15, an amorphous silicon layer may be deposited.

A first photoresist film is coated over the polysilicon layer 15 and then selectively removed in such a manner that only its portion disposed over the N-well 11 is left, thereby forming a first photoresist film pattern 16. Phosphorous ions are then implanted in the portion of the polysilicon film 15 disposed over the N type MOSFET transistor using the first photoresist film pattern 16 disposed over the P type MOSFET transistor as a mask. The implantation of phosphorous ions is carried out with energy of about 40 to 60 KeV and a dose of about $3\times10^{15}$ to $1\times10^{16}$/cm$^2$.

Figure 3:
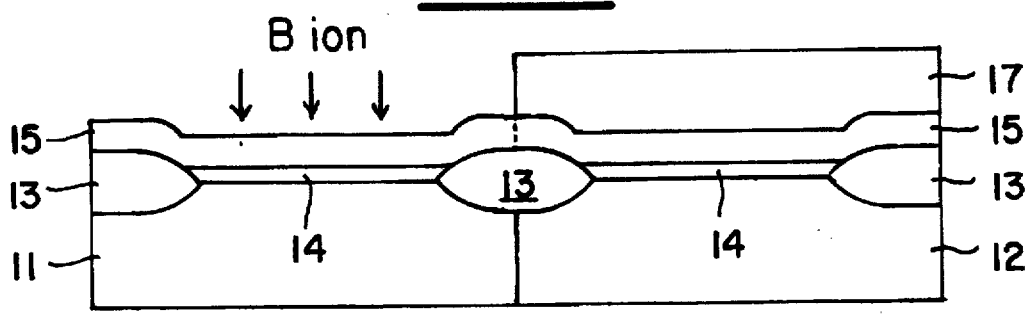

Thereafter, the first photoresist film pattern 16 is completely removed, as shown in FIG. 3. A second photoresist film is then coated over the entire exposed upper surface of the resulting structure. The second photoresist film is then selectively removed in such a manner that it remains at only its portion disposed over the P-well 12, thereby forming a second photoresist film pattern 17.

Subsequently, boron ions are then implanted in the portion of the polysilicon film 15 disposed over the P type MOSFET transistor using the second photoresist film pattern 17 disposed over the N type MOSFET transistor as a mask. The implantation of boron ions is carried out with energy of about 10 KeV or less and a dose of about $3\times10^{15}$ to $1\times10^{16}$/cm$^2$.

Figure 4:
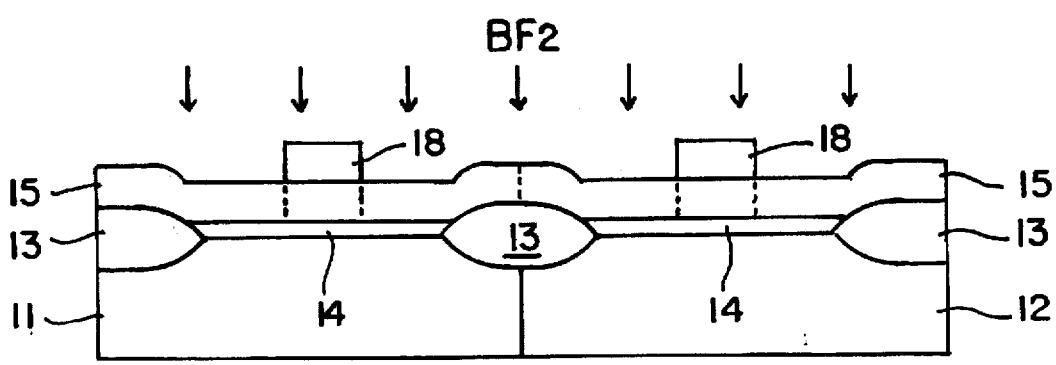

The second photoresist film pattern 17 is then completely removed, as shown in FIG. 4. Thereafter, a third photoresist film is coated over the entire exposed upper surface of the resulting structure. The third photoresist film is then selectively removed in such a manner that it remains at only its portions respectively disposed over regions where p and n type gate electrodes will be formed. Thus, a third photoresist film pattern 18 is formed.

Using the third photoresist film pattern 18 as a mask, boron fluoride ions (BF$_2$) are implanted in the polysilicon film 15. The implantation of boron fluoride ions is carried out with energy of about 15 to 30 KeV and a dose of about $3\times10^{15}$ to $1\times10^{16}$/cm$^2$.

At this ion implantation step, the region, where an n type gate electrode will be formed, is prevented from being implanted with boron fluoride ions by virtue of the third photoresist film pattern 18. Also, the portions of the polysilicon film 15 respectively disposed over regions, where n$^+$ source/drain will be formed, serve as a barrier layer for preventing the boron fluoride ions from penetrating into the P-well region because their structure is changed to an amorphous structure due to the phosphorous ions implanted at the previous processing step. The region, where a P type gate electrode will be formed, is also prevented from being implanted with boron fluoride ions by virtue of the third photoresist film pattern 18.

On the other hand, in the remaining boron-doped portion of the polysilicon film 15, the boron ions are mixed with the boron fluoride ions implanted in the film 15.

Figure 5:
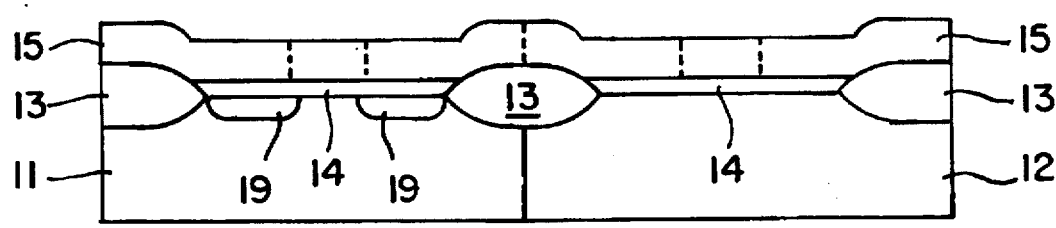

Thereafter, the third photoresist film pattern 18 is completely removed, as shown in FIG. 5. The resulting structure is annealed at a temperature of about 850° to 900° C. in a nitrogen atmosphere for about 30 to 60 minutes, thereby forming p$^+$ source/drain 19.

At this annealing step, the phosphorous ions implanted in the region, where an n type gate electrode will be formed, are electrically activated whereas the boron ions implanted in the regions, where a P type gate electrode will be formed, are diffused into the polysilicon film.

Although the boron ions are electrically activated, the diffusion thereof into the polysilicon film via the gate oxide film 14 is difficult due to the annealing conducted in the nitrogen atmosphere. On the other hand, the boron ions and boron fluoride ions present in the portions of the polysilicon film 15 respectively disposed over the p$^+$ source/drain 19 are diffused into the polysilicon film via the gate oxide film 14 while the annealing step is conducted in the nitrogen atmosphere. The diffusion of boron ions into the polysilicon film via the gate oxide film is possible because the gate oxide film has a small thickness, and the fluorine serves to increase the diffusion coefficient of boron.

In contrast, the annealing may be carried out at a temperature of about 1,000° to 1,100° C. in a nitrogen atmosphere for about 10 to 30 seconds.

The polysilicon film 15 is initially implanted with boron ions in a dose of about $3\times10^{15}$ to $1\times10^{16}$/cm$^2$ and boron fluoride ions in a dose of about $3\times10^{15}$ to $1\times10^{16}$/cm$^2$. This means that boron ions are implanted in the source/drain 19 in a total dose of about $6\times10^{15}$ to $2\times10^{16}$/cm$^2$. Accordingly, the amount of boron ions diffused into the silicon film via the silicon oxide film is sufficient to provide source/drain.

Figure 6:
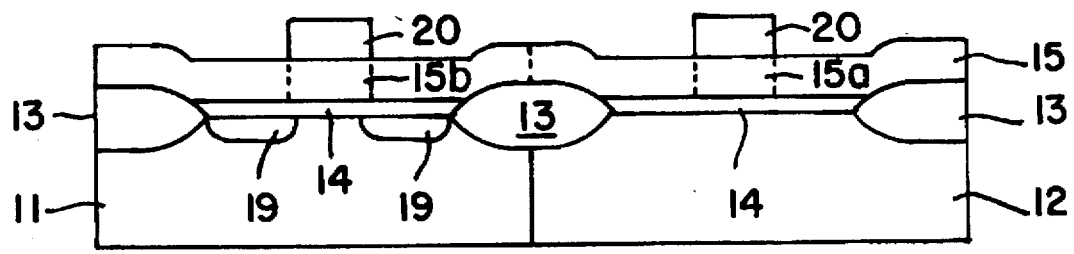

Thereafter, a fourth photoresist film is formed over the entire exposed upper surface of the resulting structure, as shown in FIG. 6. The fourth photoresist film is then selectively removed in such a manner that it remains only at its portions respectively disposed over the portions of the polysilicon film 15 where the n and p type gate electrodes will be formed. In this way, a fourth photoresist film pattern 20 is formed.

Using the fourth photoresist film pattern 20 as a mask, the polysilicon film 15 is then selectively removed, thereby forming n and p type gate electrodes 15a and 15b.

Figure 7:
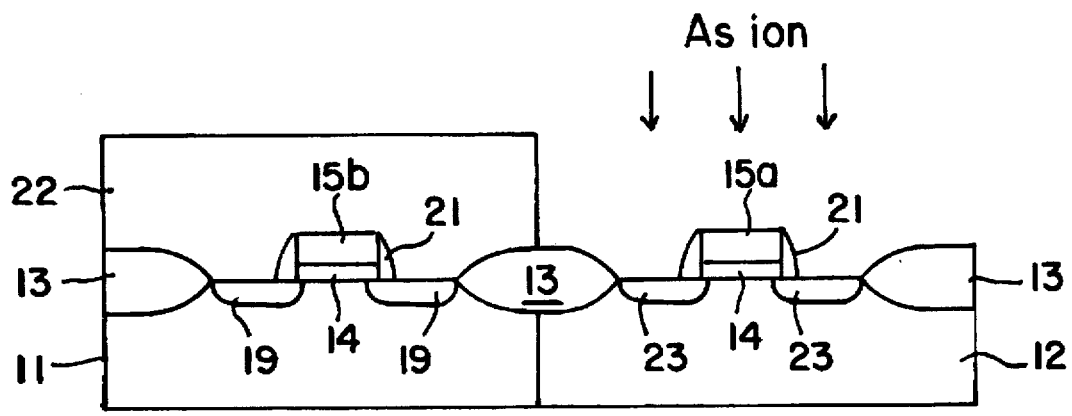

Subsequently, the fourth photoresist film is completely removed, as shown in FIG. 7. Spacer oxide films 21 are then formed on opposite side walls of the n and p type gate electrodes 15a and 15b, respectively.

A fifth photoresist film is then coated over the entire exposed upper surface of the resulting structure. The fifth photoresist film is then selectively removed in such a manner that it is left at its portion disposed over the N-well 11, thereby forming a fifth photoresist film pattern 22.

Using the fifth photoresist film pattern 22 as a mask, arsenic ions are then implanted in the P-well 12, thereby forming $n^+$ source/drain 23.

Figure 8:
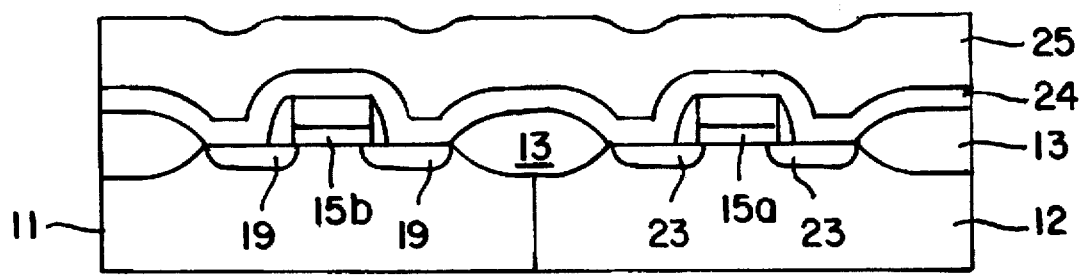

A first interlayer insulating film 24 is then formed over the entire exposed upper surface of the resulting structure, as shown in FIG. 8. Subsequently, a second interlayer insulating film 25 is formed over the first interlayer insulating film 24 to provide a planarized surface.

In order to obtain the planarized surface, the resulting structure is annealed at a temperature of about 800° to 850° C. in a nitrogen atmosphere for about 30 to 60 minutes.

During this annealing, an ion diffusion is hardly carried out in the $p^+$ source/drain 19 formed using an ion diffusion at the previous step. This is because the formation of the $p^+$ source/drain 19 is achieved without using an ion implanting device, so that the $p^+$ source/drain 19 has no defects. Accordingly, the $p^+$ source/drain 19 remains in a shallow junction state during the above-mentioned annealing.

Although the $n^+$ source/drain 23 are formed using an ion implanting device, shallow junctions are formed because the diffusion coefficient of the arsenic is small.

As is apparent from the above description, the method of present invention has various effects.

That is, in accordance with the present invention, it is possible to form a shallow junction because polysilicon implanted with boron ions and boron fluoride ions is used as a diffusion source by utilizing the characteristic of fluorine to increase the diffusion of boron in an oxide film.

In accordance with the present invention, it is possible to easily adjust the depth of the junction by appropriately adjusting the annealing time.

It is also possible to form $p^+$ source/drain using a diffusion method in accordance with the present invention.

Thus, the formation of a shallow junction can be achieved in accordance with the present invention. Accordingly, the formation of defects is reduced. This results in an improvement in the electrical characteristics, such as junction leakage current value, of the semiconductor device which is obtained.

Therefore, the method of the present invention is appropriate for the fabrication of semiconductor devices having an ultra-high integration degree.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device comprising the steps of:

providing a semiconductor substrate formed with a first and second conductive type wells and element-isolating films;

forming gate oxide films on the first and second conductive type wells, respectively;

forming a polysilicon film over the entire exposed upper surface of the resulting structure obtained after the formation of the gate oxide films;

implanting first impurity ions having an first type conductivity in a portion of the polysilicon film disposed over the second conductive type well;

implanting first impurity ions having a second type conductivity in a portion of the polysilicon film disposed over the first conductive type well;

implanting second impurity ions having the second type conductivity in portions of the polysilicon film except for portions which will be used as gate electrodes;

annealing the resulting structure obtained after the implantation of the second impurity ions in such a manner that the first impurity ions having the second type conductivity are diffused into the first conductive type well, thereby forming a second conductive type source/drain;

selectively removing the polysilicon film, thereby forming first and second conductive type gate electrodes; and implanting second impurity ions having the first type conductivity in an exposed surface portion of the second conductive type well, thereby forming a first conductive type source/drain.

2. The method in accordance with claim 1, wherein the gate oxide films have a thickness of about 30 to 60 Å.

3. The method in accordance with claim 1, wherein the formation of the gate oxide films is carried out using a thermal oxidation process.

4. The method in accordance with claim 1, wherein the polysilicon film has a thickness of about 1,500 to 2,500 Å.

5. The method in accordance with claim 1, wherein an amorphous silicon film is formed instead of the polysilicon film.

6. The method in accordance with claim 1, wherein the first impurity ions having the first type conductivity are phosphorous ions.

7. The method in accordance with claim 6, wherein the phosphorous ions are implanted at an energy of about 40 to 60 KeV in a dose of about $3 \times 10^{15}$ to $1 \times 10^{16}/cm^2$.

8. The method in accordance with claim 1, wherein the first impurity ions having the second type conductivity are boron ions.

9. The method in accordance with claim 8, wherein the boron ions are implanted at an energy of about 10 KeV or less in a dose of about $3 \times 10^{15}$ to $1 \times 10^{16}/cm^2$.

10. The method in accordance with claim 1, wherein the second impurity ions having the second type conductivity are boron fluoride ions.

11. The method in accordance with claim 10, wherein the boron fluoride ions are implanted at an energy of about 15 to 30 KeV in a dose of about $3 \times 10^{15}$ to $1 \times 10^{16}/cm^2$.

12. The method in accordance with claim 1, wherein the annealing step is carried out at a temperature of about 850° to 900° C. in a nitrogen atmosphere for 30 to 60 minutes.

13. The method in accordance with claim 1, wherein the annealing step is rapidly carried out at a temperature of about 1,000° to 1,100° C. in a nitrogen atmosphere for 10 to 30 seconds.

14. The method in accordance with claim 1, wherein the step of forming the first and second type electrodes comprises the steps of forming a photoresist film pattern on the polysilicon film, and selectively removing the polysilicon film under the condition in which the photoresist film pattern is used as a mask.

15. The method in accordance with claim 1, wherein the second impurity ions having the first type conductivity are arsenic-ions.

16. The method in accordance with claim 1, further comprising the step of forming side wall oxide films on opposite side walls of the first and second conductive type gate electrodes, respectively.

17. The method in accordance with claim 1, wherein the first conductive type well is a n type well and the second conductive type well is a p type well.

18. The method in accordance with claim 1, further comprising the step of sequentially forming first and second interlayer insulating films over the entire exposed upper surface of the resulting structure obtained after the implantation of the second impurity ions having the first type conductivity.

19. The method in accordance with claim 18, further comprising the step of annealing the resulting structure is carried out at a temperature of about 800° to 850° C. in a nitrogen atmosphere for about 30 to 60 minutes.

20. A method for fabricating a semiconductor device comprising the steps of:

providing a semiconductor substrate formed with n and p type wells and element-isolating films;

forming gate oxide films on the n and p type wells, respectively;

forming a polysilicon film over the entire exposed upper surface of the resulting structure obtained after the formation of the gate oxide films;

forming a first photoresist film pattern on a portion of the polysilicon film disposed over the n type well;

implanting first impurity ions having an n type conductivity in a portion of the polysilicon film disposed over the p type well by use of the first photoresist film pattern as a mask;

removing the first photoresist film pattern, and forming a second photoresist film pattern on the portion of the polysilicon film disposed over the p type well;

implanting first impurity ions having a p type conductivity in the portion of the polysilicon film disposed over the n type well by use of the second photoresist film pattern as a mask;

removing the second photoresist film pattern, and forming a third photoresist film pattern on the portions of the polysilicon film respectively disposed over the n and p type wells;

implanting second impurity ions having the p type conductivity in the polysilicon film by use of the third photoresist film pattern as a mask;

removing the third photoresist film pattern, and annealing the resulting structure, thereby forming $p^+$ source/drain in the n type well;

selectively removing the polysilicon film, thereby forming n and p type gate electrodes;

forming a fourth photoresist film pattern on the exposed surface of the gate oxide film disposed over the n type well; and implanting second impurity ions having the n type conductivity in an exposed surface portion of the p type well, thereby forming $n^+$ source/drain.

* * * * *